United States Patent
Lee et al.

(10) Patent No.: US 6,706,550 B2
(45) Date of Patent: *Mar. 16, 2004

(54) PHOTODIODE HAVING A PLURALITY OF PN INJECTIONS AND IMAGE SENSOR HAVING THE SAME

(75) Inventors: Ju Il Lee, Ichon-shi (KR); Myung Hwan Cha, Ichon-shi (KR); Nan Yi Lee, Ichon-shi (KR)

(73) Assignee: Hyundai Electronics Industries Co, Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/272,842

(22) Filed: Oct. 16, 2002

(65) Prior Publication Data

US 2003/0030083 A1 Feb. 13, 2003

Related U.S. Application Data

(62) Division of application No. 09/340,750, filed on Jun. 28, 1999.

(30) Foreign Application Priority Data

Jun. 27, 1998 (KR) .............................. 98-24575
Jun. 29, 1998 (KR) .............................. 98-24643

(51) Int. Cl.[7] .............................................. H01L 21/00
(52) U.S. Cl. ...................... 438/57; 438/81; 257/233; 257/292
(58) Field of Search ................... 438/57, 81; 257/233, 257/292

(56) References Cited

U.S. PATENT DOCUMENTS

| | | | |
|---|---|---|---|
| 4,984,047 A | | 1/1991 | Stevens |
| 5,051,797 A | | 9/1991 | Erhardt |
| 5,841,159 A | | 11/1998 | Lee et al. |
| 5,977,576 A | | 11/1999 | Hamasaki |
| 6,100,556 A | | 8/2000 | Drowley et al. |
| 6,127,697 A | | 10/2000 | Guidash |
| 6,180,969 B1 | * | 1/2001 | Yang et al. .................. 257/291 |
| 6,184,055 B1 | * | 2/2001 | Yang et al. .................... 438/57 |
| 6,388,243 B1 | * | 5/2002 | Berezin et al. .......... 250/208.1 |

* cited by examiner

Primary Examiner—John F. Niebling
Assistant Examiner—Viktor Simkovic
(74) Attorney, Agent, or Firm—Townsend and Townsend and Crew LLP

(57) ABSTRACT

The present invention relates to a pinned photodiode for an image sensor and a method for manufacturing the same; and, more particularly, to a pinned photodiode of an image sensor fabricated by CMOS processes and a manufacturing method thereof The pinned photodiode, according to an embodiment of the present invention, includes a semiconductor layer of a first conductivity type; and at least two first doping regions of a second conductivity type alternately formed in the semiconductor layer and connected to each other at edges thereof so that the first doping regions have the same potential, wherein a plurality of PN junctions is formed in the semiconductor layer and the PN junctions improves a capturing capacity of photoelectric charges generated in the photodiode.

12 Claims, 10 Drawing Sheets

PHOTODIODE HAVING A PLURALITY OF PN INJECTIONS AND IMAGE SENSOR HAVING THE SAME

FIELD OF THE INVENTION

The present invention relates to a pinned photodiode of an image sensor and a method for manufacturing the same; and, more particularly, to a pinned photodiode of an image sensor fabricated by CMOS processes (hereinafter, referred to as a "CMOS image sensor") and the manufacturing method thereof.

DESCRIPTION OF THE PRIOR ART

As well-known to those skilled in the art, the pinned photodiode (PPD) has been widely used as an element to produce and integrate photoelectric charges generated in CCD or CMOS image sensors sensing light from an object and also it would be called "buried photodiode" since it has PNP (or NPN) junction structure which is buried in a substrate. As compared with the photodiode having other structures such as source/drain PN junction structure and MOS capacitor structure, etc., the PPD has various merits. One of them is that it is possible to increase the depletion depth to bring about high quantum efficiency in converting incident photons into electric charges. That is, in the PPD having the PNP junction structure, the N-type region therein is fully depleted and also the depletion region is extended to both the P-type regions with the increase of the depletion depth. Accordingly, this vertical extension of the depletion depth may increase quantum efficiency, thereby making an excellent light sensitivity.

In the meanwhile, in the case of the PNP junction PPD employed in CMOS image sensors using a power supply voltage of less than 5V or 3.3V, two P regions have to have the same potential in less than the power supply voltage (e.g., 1.2V to 2.8V) in order for the N region to be fully depleted, thereby increasing the quantum efficiency. This technology is disclosed in U.S. patent application Ser. No. 09/258,307, entitled "CMOS Image Sensor with Equivalent Potential Diode" filed on Feb. 26, 1999, which was assigned to "Hyundai Electronics Industries Co., Ltd."

FIG. 1. shows the low power PPD disclosed in U.S. patent application Ser. No. 09/258,307. As shown in FIG. 1, the PPD has a PNP structure where an $N^-$ doping region 102 and a $P^0$ doping region 101 are formed in a P-epi (epitaxial) layer. At this time, an $N^-$ ion implantation mask for forming the deep $N^-$ and a $P^0$ ion implantation mask for $P^0$ are used and they are different from each other in their pattern width. That is, the open area for the $P^0$ doping region 101 is larger than that for the $N^-$ doping region 102. By bring the P-epi layer into contact with the $P^0$ doping region 101 so that the P-epi layer and the $P^0$ doping region 101 have the same voltage in low voltage, this PPD can safely carry out a full depletion layer in the $N^-$ doping region even in low voltage of less than 3.3V.

The above PPD in FIG. 1 makes it possible the full depletion in low voltage and has an effect on, to some extent, improving the quantum efficiency. Further, it is possible to increase the depletion depth by using the P-epi layer. However, there is a problem that it is not possible to obtain so much sufficient depletion depth of the $N^-$ doping region as high light sensitivity even if a desired quantum efficiency may be obtained.

SUMMARY OF THE INVENTION

It is, therefore, an object of the present invention to provide a pinned photodiode having a increased depletion depth in comparison with the prior art and the manufacturing method thereof.

It is, therefore, another object of the present invention to provide a pinned photodiode to increase the constant charge capacity and the manufacturing method thereof.

In accordance with an aspect of the present invention, there is provided a pinned photodiode in an image sensor comprising: a semiconductor layer of a first conductive type; a first doping region of a second conductive type formed in the semiconductor layer, wherein the first doping region includes at least two multi-implantation layers which are formed by different ion acceleration energy and wherein the first doping region is apart from a field oxide layer to isolate adjacent other photodiodes; and a second doping region of the first conductive type formed between the first doping region and a surface of the semiconductor layer, wherein an area of the second doping region has larger than that of the first doping region, whereby a thickness between the first doping region and the surface of the semiconductor layer is made thin by the multi-implantation layers.

In accordance with another aspect of the present invention, there is provided a pinned photodiode in an image sensor comprising: a semiconductor layer of a first conductive type; and at least two first doping regions of a second conductive type alternatively formed in the semiconductor layer and connected to each other at edges thereof so that the first doping regions have the same potential, whereby a plurality of PN junctions are formed in the semiconductor layer and the PN junctions improves capturing capacity of photoelectric charges generated in the photodiode.

In accordance with further another aspect of the present invention, there is provided a method for forming a pinned photodiode in an image sensor, the method comprising the steps of: a semiconductor layer of a first conductive type; forming a filed oxide layer to isolate an active region from a field region; forming a first ion implantation mask of which an edge covers a portion of the active region adjacent to the field region, opening the active region; forming a first doping region through two ion implantation processes with different ion implantation energy; removing the first ion implantation mask; forming a second ion implantation mask of which an edge is arranged at a boundary between the field and active regions, opening the active region; and forming a second doping region between a surface of the semiconductor layer and the first doping region, whereby a thickness between the first doping region and the surface of the semiconductor layer is made thin by the two ion implantation processes.

In accordance with still another aspect of the present invention, there is provided a method for forming a pinned photodiode in an image sensor, the method comprising the steps of: a semiconductor layer of a first conductive type; forming a filed oxide layer to isolate an active region from a field region; patterning a gate of a transfer transistor to transfer photoelectric charges generated in the photodiode; forming a fist doping region of a second conductive type in the active region using a first ion implantation mask which covers a portion of the active region adjacent to the field region and opens an edge of the transfer transistor; forming a second doping region of the first conductive type on the first doping region using a second ion implantation mask which covers the transfer transistor; forming a third doping region of the second conductive type on the second doping region using a third ion implantation mask which covers the portion of the active region adjacent to the field region and opens an edge of the transfer transistor, wherein the first and third doping regions are connected to each other at edges thereof so that the first and third doping regions have the same potential; and forming a fourth doping region of the first conductive region on the third doping region using a fourth ion implantation mask opens the active region.

In accordance with still another aspect of the present invention, there is provided a method for forming a pinned photodiode in an image sensor, the method comprising the steps of: a semiconductor layer of a first conductive type; and alternatively forming N-type impurity regions and P-type impurity region using a first and second ion implantation masks, wherein the first ion implantation mask covers a portion of the active region adjacent to the field region and opens an edge of the transfer transistor and wherein the second ion implantation mask covers the transfer transistor.

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Hereinafter, the present invention will be described in detail referring to the accompanying drawings.

Figure 2:
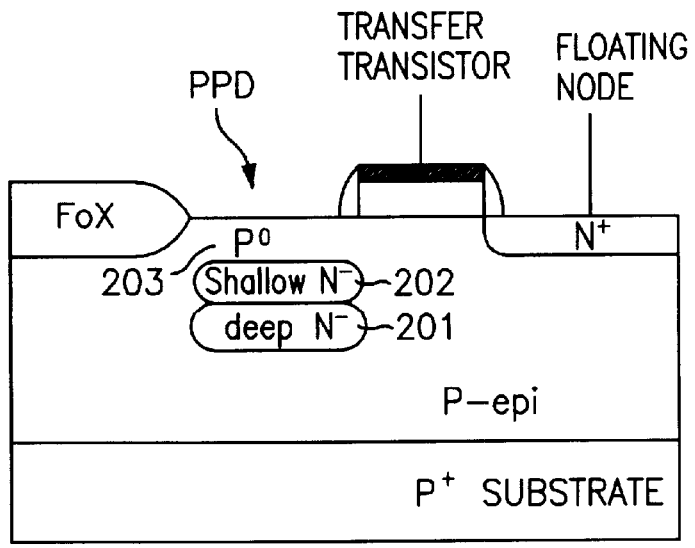
FIG. 2 is a cross-sectional view illustrating a photodiode in accordance with an embodiment of the present invention.

In FIG. 2, a PPD structure according to an embodiment of the present invention is illustrated. Referring to FIG. 2, the PPD comprises: a P-epi layer grown to a thickness of approximately 5~10 $\mu$m on a $P^+$ substrate ($P^+$ SUB); deep and shallow $N^-$ doping regions 201 and 22 which are formed within the P-epi layer and formed by the stack-up of N type impurities having different energy through two times of ion implantation; a $P^0$ doping region 203 formed between the upper part of the deep $N^-$ doping region and the surface of the P-epi layer, wherein the width of the $P^0$ doping region 203 is larger than that of the shallow $N^-$ doping region and a portion thereof is formed on the P-epi layer.

Here, the P-epi layer is set to a concentration of about E14/cm$^3$, the shallow $N^-$ doping region 202 about E17/cm$^3$ and the $P^0$ doping region 203 about E18/cm$^3$, respectively, so that the depletion depth is deeply formed into the P-epi layer.

Figure 3:
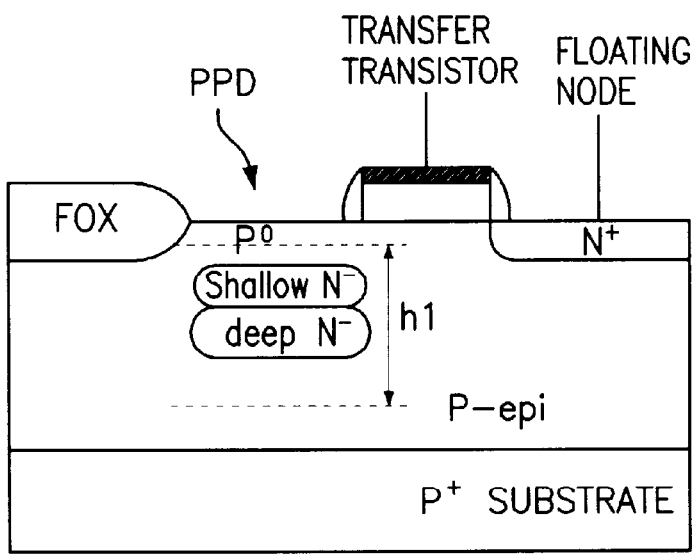
FIG. 3 is a cross-sectional view illustrating an operation of the photodiode in FIG. 2.
Figure 4:
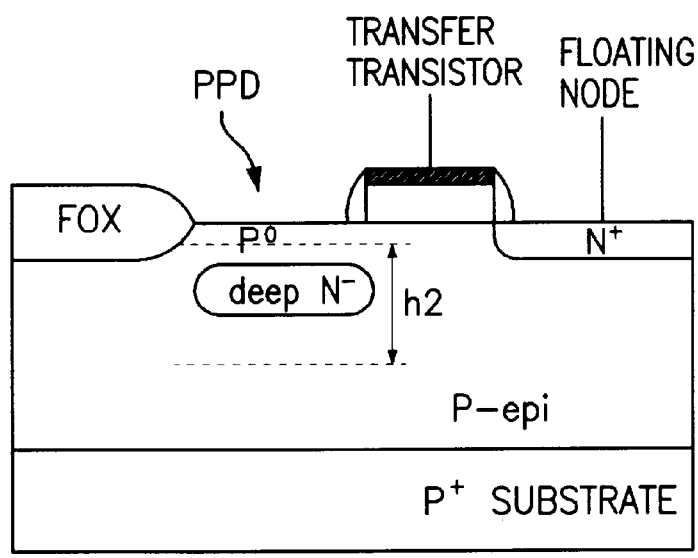
FIG. 4 is a cross-sectional view illustrating an operation of the pinned photodiode in FIG. 1.

FIGS. 3 and 4 are cross-sectional views for comparatively illustrating operations between the present invention and the prior art, through which the distinctive effects of the present invention will be described.

First, referring to FIG. 3, when a transfer transistor and a reset transistor (not shown in FIG. 3) are turned on, depletion occurs because of the applied voltage from power supply voltage and, when the shallow $N^-$ doping region 202 and the deep $N^-$ doping region 201 are fully depleted, the depletion depth is to be h1. On the contrary, in the prior illustrated in FIG. 4, the depletion depth is to be h2 when the deep $N^-$ doping region 102 beneath a $P^0$ doping region 101 is fully depleted, because there exists only the deep $N^-$ doping region. At this time, h1 is larger than h2 since the value of the thickness of the deep and shallow $N^-$ doping regions is larger than that when there exists only deep $N^-$ doping region 102 in the prior art.

Embodiments of the present invention is to increase the depletion depth in a predetermined area, by forming a deep $N^-$ doping region through several times of ion implantation having different energy levels.

FIGS. 5a to 5d are process cross-sectional views illustrating a method for manufacturing the structure of FIG. 2.

Figure 5A:
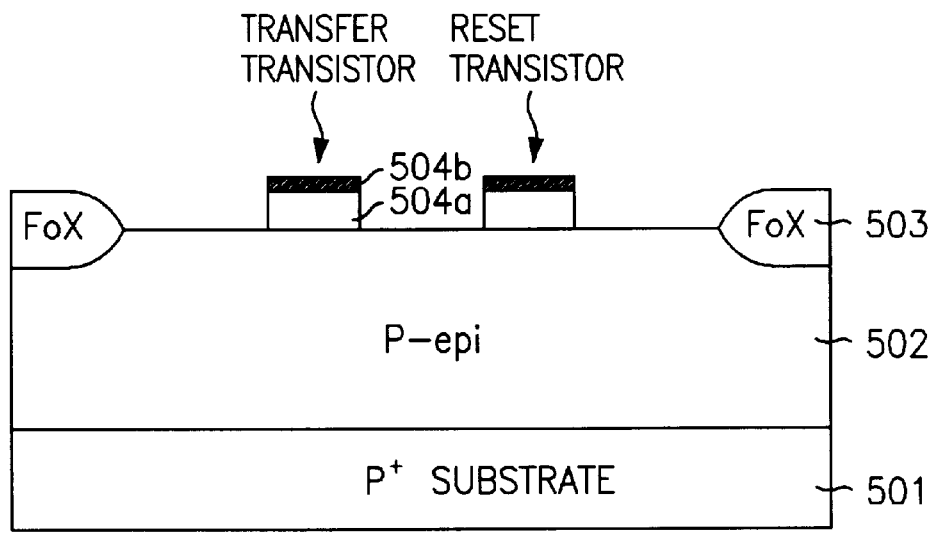
FIGS. 5a to 5d are cross-sectional views illustrating a method for fabricating the photodiode in accordance with an embodiment of the present invention.

First, referring to FIG. 5a, a Transfer transistor and a reset transistor are formed by the steps of: growing up a P-epi layer 502 having a thickness of approximately 5–10 $\mu$m on a $P^+$ substrate 501; forming a field oxide layer (FOX) for isolating elements in the P-epi 502; and forming a polysilicon layer 504a and a tungsten silicide layer 504b.

Figure 5B:
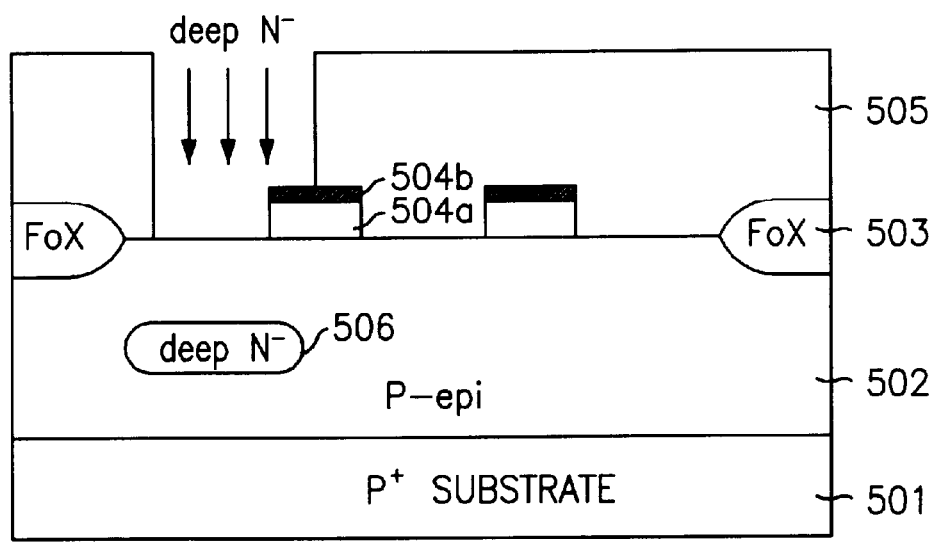
Figure 6A:
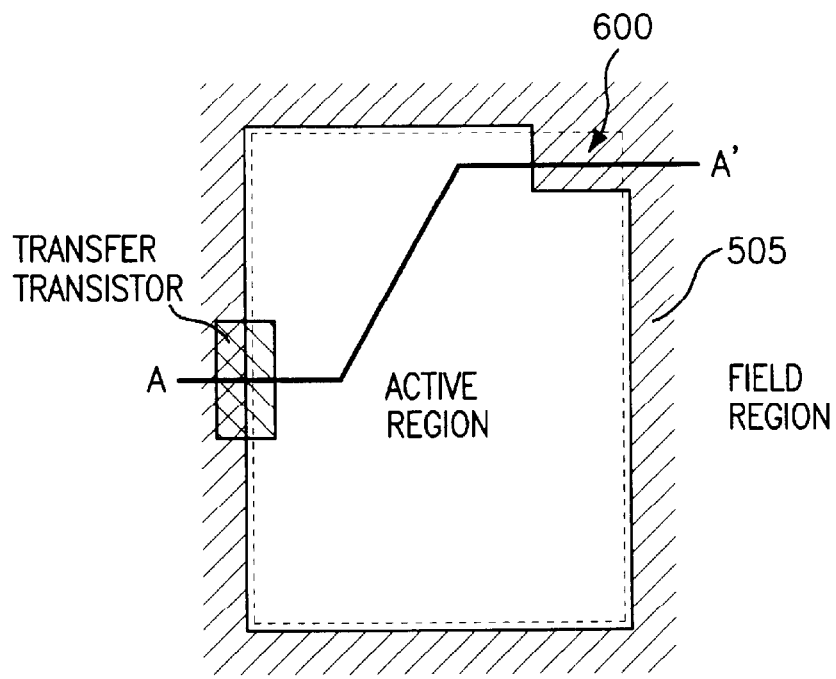
FIGS. 6a and 6b are layouts illustrating N– and $P^0$ ion implantation masks, respectively.

Subsequently, as illustrated in FIG. 5b, a deep $N^-$ doping region 506 is formed sing an $N^-$ ion implantation mask 505 and carrying out $N^-$ ion-implantation processes with high energy of more than about 200 keV. At this time, the layout of the N– ion implantation mask 505 is illustrated in FIG. 6a where the $N^-$ ion implantation mask 505 has a pattern covering a portion of an active region 600. Accordingly, the edge of the $N^-$ ion implantation mask 505 should be substantially arranged on the active region in vicinity of the and field region. That is, the deep $N^-$ doping region 506 is not formed in a portion of the edge of the active region 600 where PPD is to be formed, because the N type impurities are not implanted into such a portion of an active region 600.

Figure 5C:
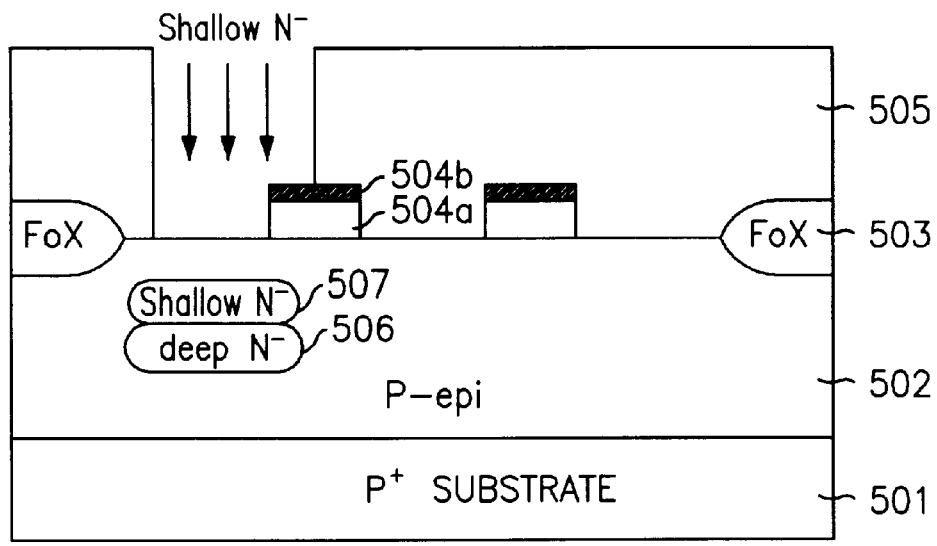

Next, as illustrated in FIG. 5c, a shallow $N^-$ doping region 507 is formed by carrying out another $N^-$ ion implantation processes with low energy of less than about 100 keV, using the same mask as the $N^-$ ion implantation mask 505. In similar to the deep $N^-$ doping region 506, the shallow N– doping region 507 is not formed in a portion of the edge of active region 600.

Figure 5D:
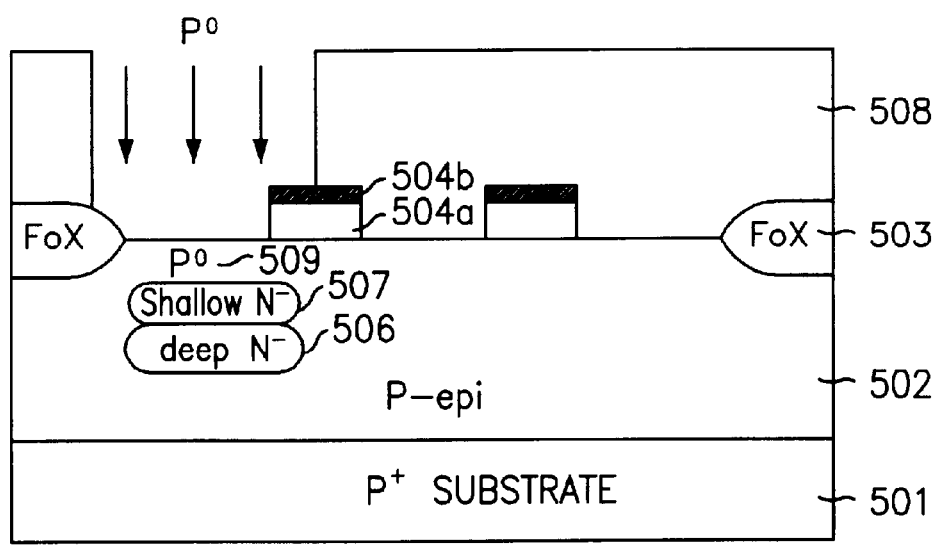
Figure 6B:
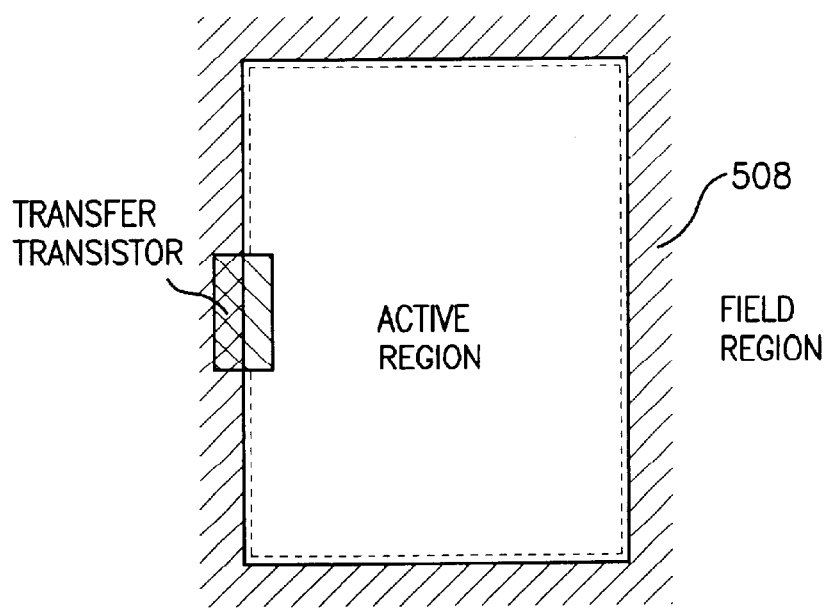

Further, as illustrated in FIG. 5d, a $P^0$ 509 is formed through the steps of: removing the N– ion implantation mask 505; forming a $P^0$ ion implantation mask 508 for forming $P^0$; and carrying out $P^0$ ion implantation processes. As illustrated in FIG. 6b, the $P^0$ ion implantation mask 508 is patterned to open all active regions where PPD is to be formed.

Figure 7:
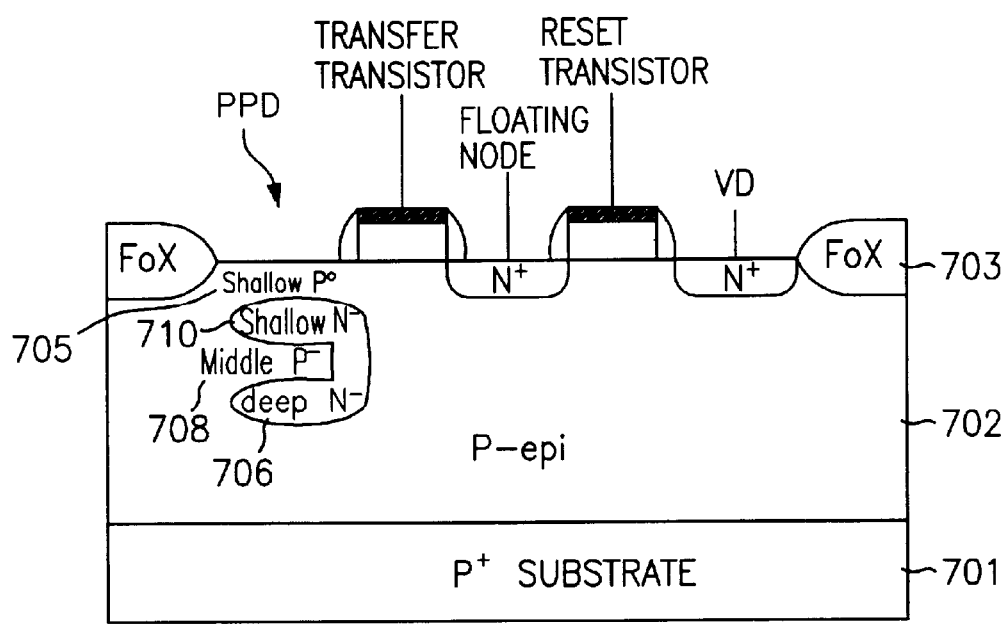
FIG. 7 is a cross-sectional view illustrating a photodiode in accordance with another embodiment of the present invention.

In FIG. 7, a PPD structure according to another embodiment of the present invention is illustrated. Referring to FIG. 7, the PPD structure according to another embodiment of the present invention includes a P-epi layer 702 grown to a thickness of approximately 5~10 $\mu$m on a $P^+$ substrate 701 and a shallow $N^-$ doping region 710 formed within the P-epi layer 702 and disposed at the lower part of the edge of a transfer transistor. In addition, a deep $N^-$ doping region 706 is formed within the P-epi layer 702, being apart from the shallow $N^-$ doping region 710 in the vertical direction.

However, the deep N⁻ doping region 706 is mutually connected to the deep N⁻ doping region 706 at left edge of the transfer transistor. Accordingly, an inclined U-shaped N⁻ doping region is formed within the P-epi layer 702. Furthermore, a middle P⁻ doping region 708 is disposed between the shallow N⁻ doping region 710 and the deep N⁻ doping region 706 so that the concentration of the middle P⁻ doping region 708 may be higher than that of the P-epi layer 702. A shallow P⁰ doping region 705 is disposed on the shallow N⁻ doping region 710 and beneath the surface of the P-epi layer 702.

Meanwhile, the present invention is set in conditions that P-epi layer has a dopant concentration of approximately E14/cm³, each of the shallow N⁻ doping region 710 and the middle P⁻ doping region 708 have a dopant concentration of approximately E17/cm³ and the shallow P⁰ doping region 705 has a dopant concentration of approximately E18/cm³.

As a result, the pinned photodiode according to another embodiment of the present invention has four PN junctions, i.e., a first PN junction between the shallow P⁰ doping region 705 and the shallow N⁻ doping region 710, a second PN junction between the middle P⁻ doping region 708 and the shallow N⁻ doping region 710, a third PN junction between the deep N⁻ doping region 706 and the middle P⁻ doping region 708, and a fourth PN junction between the deep N⁻ doping region 706 and the lower P-epi layer 702. Of course, this multiple PN junction structure can be provided by alternatively forming the N-type doping regions and the P-type doping regions within the P-epi layer 702. In order to insure that the P-type doping regions have the same potential in the P-epi layer 702, the shallow P⁰ doping region 705, the middle P⁻ doping region 708 and the P-epi layer 702 should be directly in contact with each other in the vicinity of the field oxide layer. Accordingly, it becomes possible to accomplish complete implantation in CMOS image sensor using power supply voltage of less than 3.3V.

Figure 1:
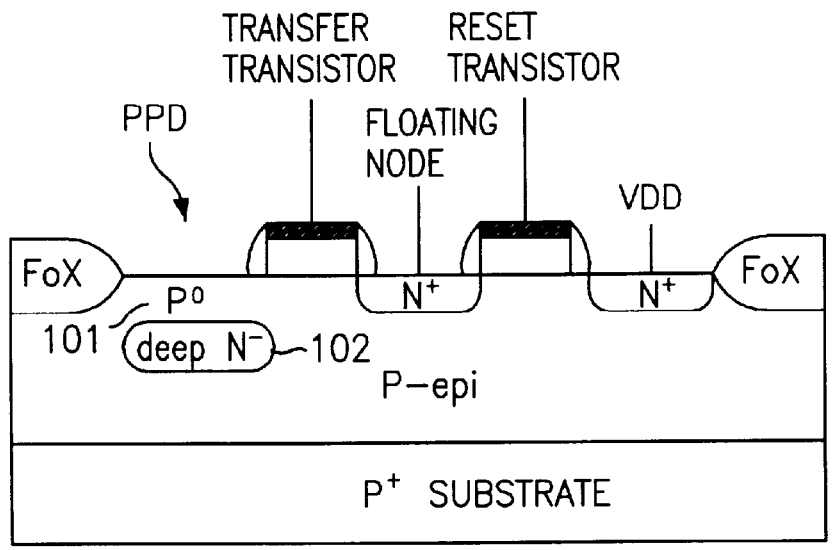
FIG. 1 is a cross-sectional view illustrating a conventional pinned photodiode.

Eventually, the PPD according to another embodiment of the present invention lets the charge capacity be larger than the prior art in FIG. 1 which has only two PN junctions. That is, the increased capacity to save photogenerated charges makes it possible to obtain a desired sufficient quantum efficiency which an excellent sensor wants. Furthermore, it is possible to obtain the deeper depletion depth than the prior art since the middle P⁻ doping region 708, the deep N⁻ doping region 706 and the shallow N⁻ doping region 710 are all completely implanted, thereby further increasing the area to collect the photogenerated charges and obtaining the quantum efficiency image which the sensor wants.

FIGS. 8a to 8e are cross-sectional views illustrating a method for fabricating the photodiode in accordance with another embodiment of the present invention.

Figure 8A:
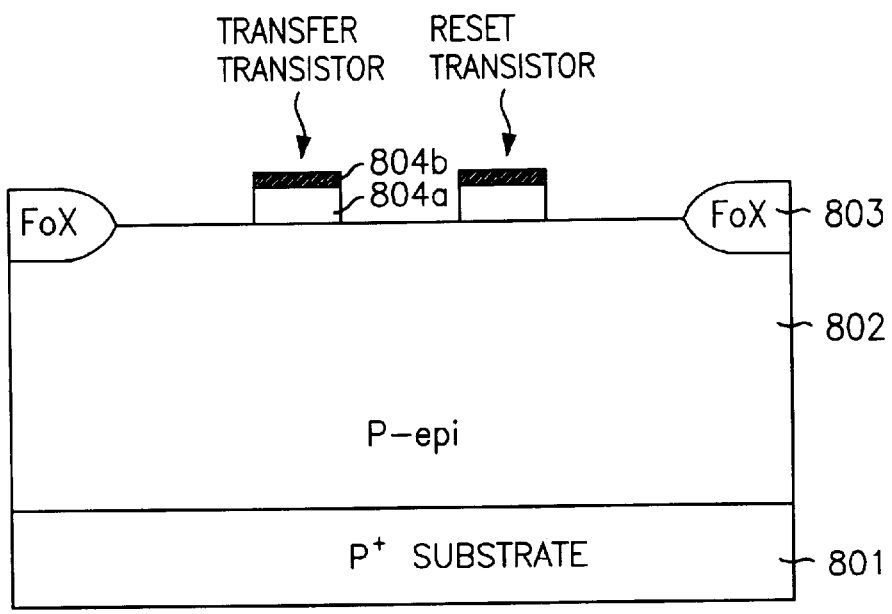
FIGS. 8a to 8e are cross-sectional views illustrating a method for fabricating the photodiode in accordance with another embodiment of the present invention.

First, as shown in FIG. 8a, a P-epi layer 802 is grown to a thickness of 5~10 μm on a P⁺ substrate 801 and field oxide layers 803 for isolating elements is formed in the P-epi layer 802. Also, a polysilicon layer 804a and a tungsten silicide layer 804b are formed on the P-epi layer 802 to form transfer and reset transistors through mask and etching processes.

Figure 8B:
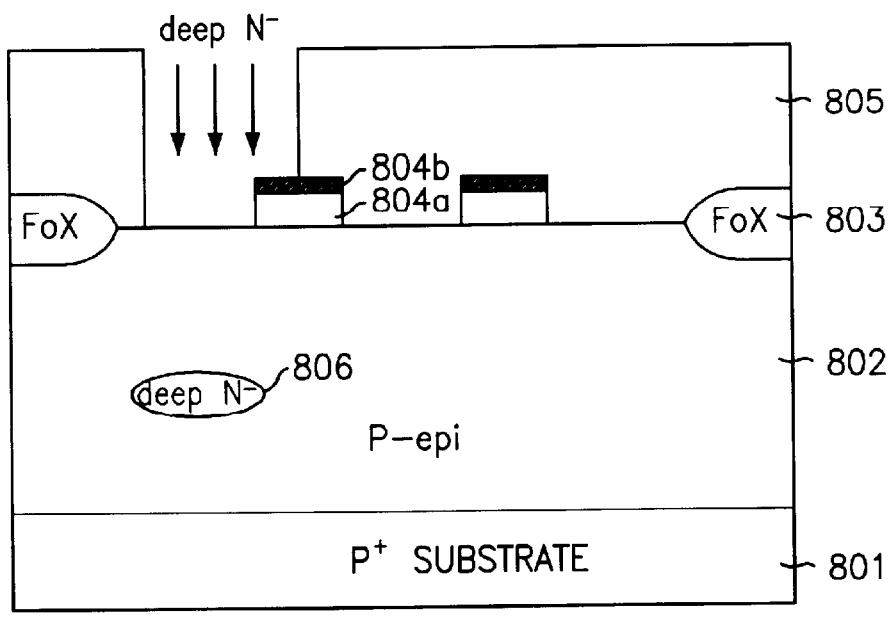
Figure 9A:
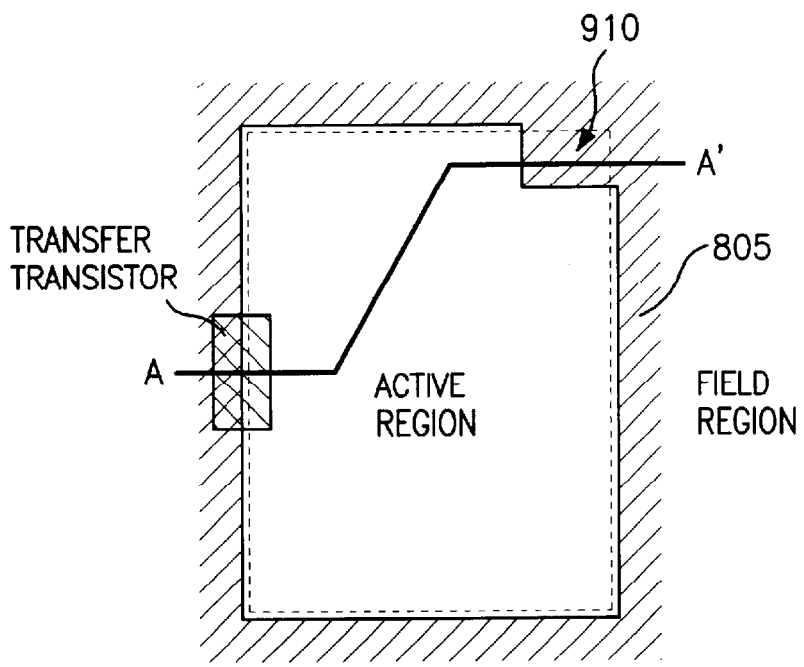
FIGS. 9a to 9c are layouts illustrating ion implantation masks.

Next, as shown in FIG. 8b, a deep N⁻ doping region 806 is formed by an N⁻ ion implantation processes with high energy of approximately 200KeV using an N⁻ ion implantation mask 805. A layout of the N⁻ ion implantation mask 805 is illustrated in FIG. 9a, the N⁻ ion implantation mask 805 has a pattern of covering a portion of an active region 910 and exposing a portion of the gate of the transfer transistor, wherein the edge of the N⁻ ion implantation mask 805 should be substantially arranged on the active region 900 for forming the PPD. That is, as illustrated in FIG. 5, the deep N⁻ doping region 806 is not formed in a portion of the edge of active region 910 where PPD is to be formed, because N-type impurities are not implanted into such a portion.

Figure 8C:
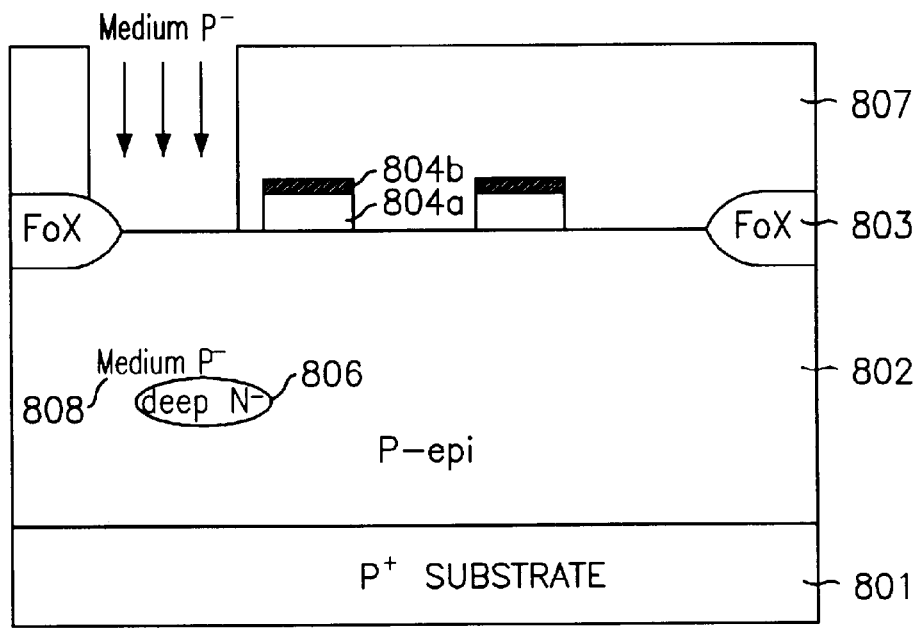
Figure 9B:
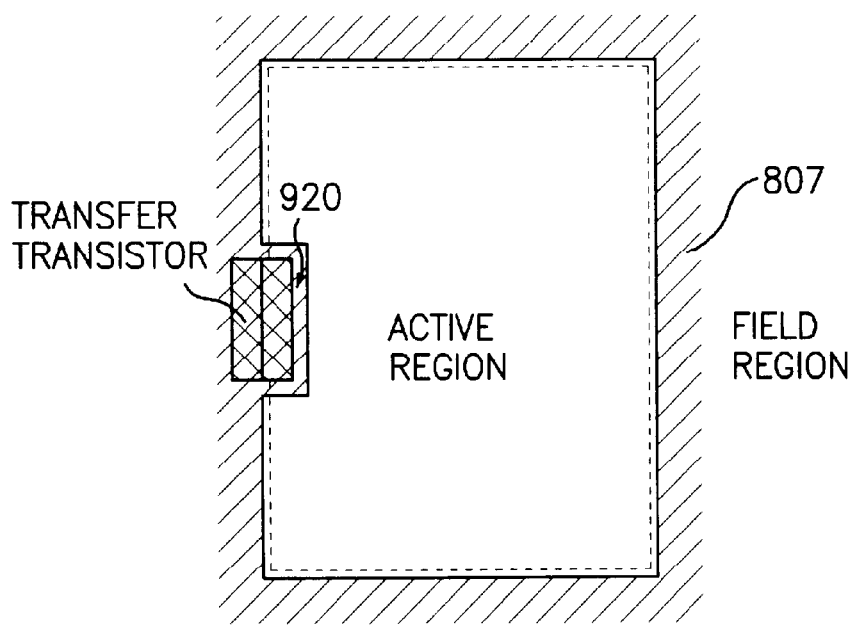

Continuously, as shown in FIG. 8c, a middle P⁻ doping region 808 is formed on the deep N⁻ doping region 806, by removing the N⁻ ion implantation mask 805, forming a P⁻ ion implantation mask 807 and carrying out P⁻ ion implantation processes with heavy energy of approximately 150KeV. As illustrated in FIG. 9b, the P⁻ ion implantation mask 807 is patterned to fully cover the transfer transistor and the edge of the P⁻ ion implantation mask 807 should be substantially arranged at boundary between active region and the field region or on the field region. That is, the middle P⁻ doping region 806 is not formed in the lower part of the transfer transistor because the P⁻ ion implantation mask 807 covers a left portion of the transfer transistor.

Figure 8D:
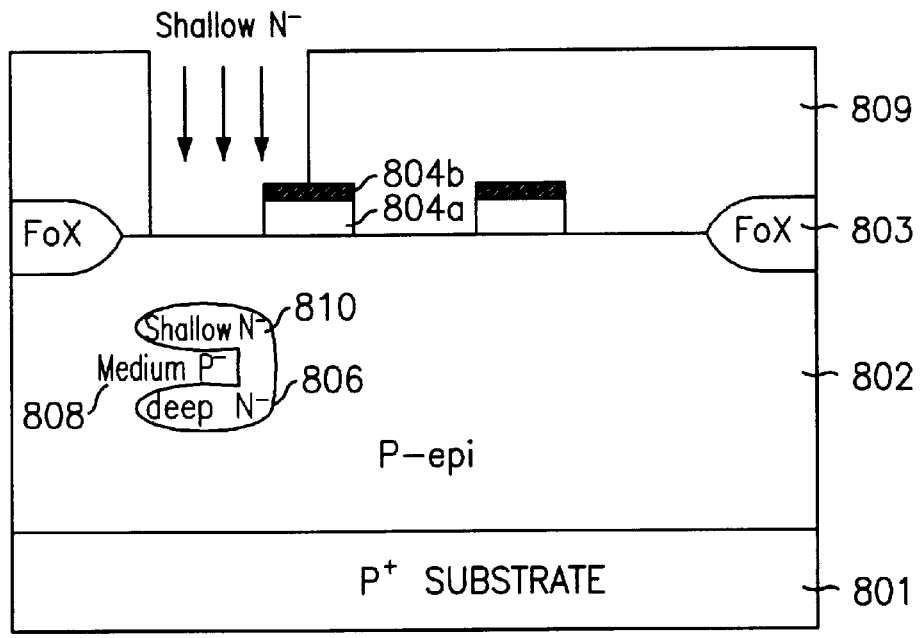

As shown in FIG. 8d, after removing the P⁻ ion implantation mask 807, a shallow N⁻ doping region 810 is formed on the middle P⁻ doping region 808 using the P⁻ ion implantation mask 809 which is the same as the N⁻ ion implantation mask 805. In the preferred embodiment, the ion implantation for N-type impurities is carried out in a range of approximately 100 keV. It should be noted that an edge of the P⁻ ion implantation mask 809 is positioned on the top of the polysilicon layers 804a. So, the deep N⁻ doping region 806 and the shallow N⁻ doping region 810 are directly connected under the tungsten silicide layer 804b of the transfer transistor.

Figure 8E:
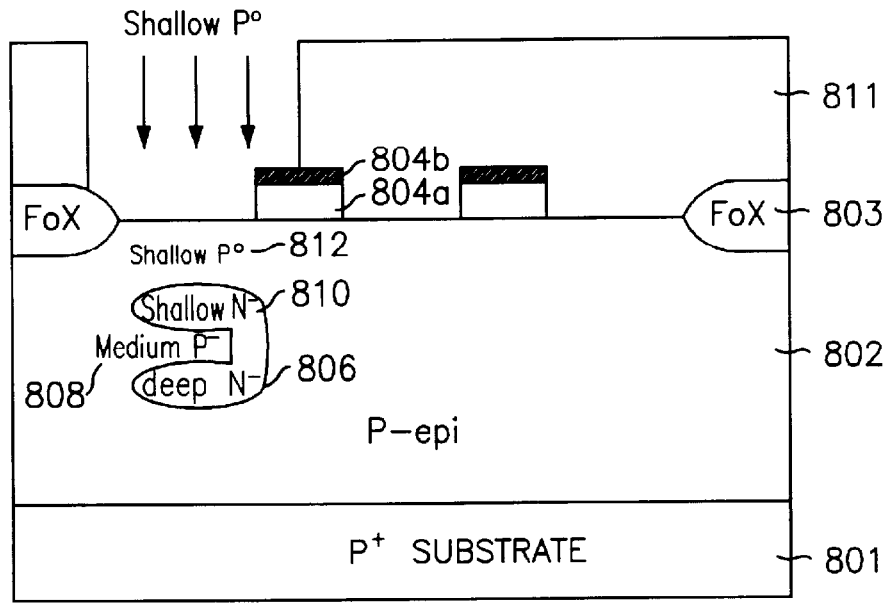
Figure 9C:
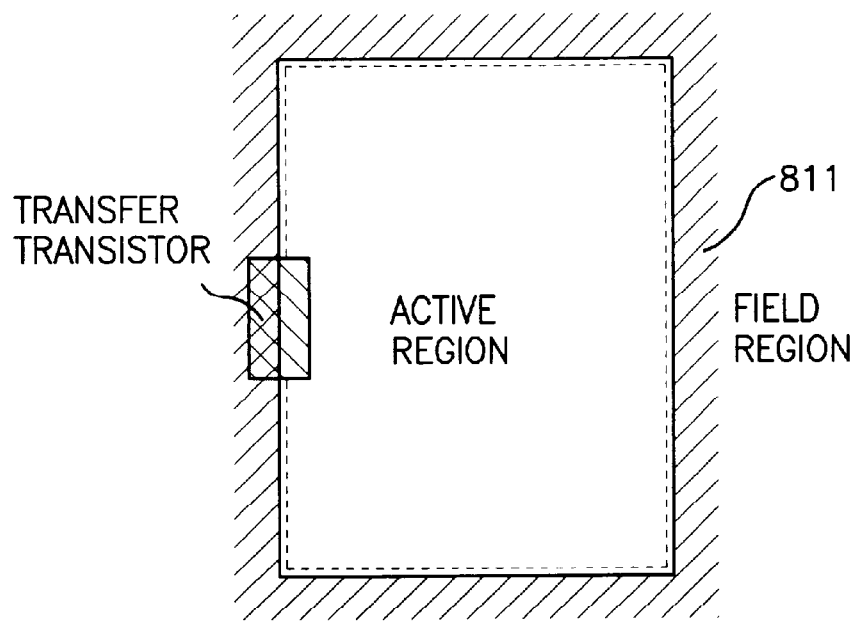

As shown in FIG. 8e, a shallow P⁰ 812 is formed by removing the N⁻ ion implantation mask 809, forming a P⁰ ion implantation mask 811 and carrying out ion implantation with low energy of less than about 50KeV. As illustrated in FIG. 9c, the P⁰ ion implantation mask 811 is patterned to open all the active region 910 where PPD is to be formed.

The PPD according to the present invention increases the depth of the depletion region by forming a plurality of PN junctions. This increase of the depletion region through a plurality of PN junctions concentrates the photogenerated charges, which are produced by the incident photons, into the light sensing region of the CMOS image sensor, increasing the charge accumulating capacity of the PPD. This large charge accumulating capacity may lead good light sensitivity and an improvement of the resolution of the CMOS image sensor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a pinned photodiode for an image sensor, the method comprising the steps of:
   preparing a semiconductor layer of a first conductivity type;
   forming a field oxide layer to isolate an active region from a field region;
   forming a first ion implantation mask, an edge of which covers a portion of the active region adjacent to the field region;
   opening the active region;
   forming a first doping region through two ion implantation processes, each implantation process using a different ion implantation energy;

removing the first ion implantation mask;

forming a second ion implantation mask, an edge of which is positioned at a boundary between the field and active regions;

opening the active region; and forming a second doping region between a surface of the semiconductor layer and the first doping region, wherein a thickness between the first doping region and the surface of the semiconductor layer is made thin by the two ion implantation processes.

2. The method as recited in claim 1, wherein the semiconductor layer is an epitaxial layer formed on a semiconductor substrate of the first conductivity type.

3. The method as recited in claim 2, wherein the semiconductor layer has an impurity concentration of approximately E14/cm3, wherein the first doping region has an impurity concentration of approximately E17/cm3, and wherein the second doping region has an impurity concentration of approximately E18/cm3.

4. The method as recited in claim 1, wherein the first and second conductivity types are P-type and N-type, respectively.

5. A method for forming a pinned photodiode for an image sensor, the method comprising the steps of:

preparing a semiconductor layer of a first conductivity type;

forming a field oxide layer to isolate an active region from a field region;

patterning a gate of a transfer transistor to transfer photoelectric charges generated in the photodiode;

forming a first doping region of a second conductivity type in the active region using a first ion implantation mask which covers a portion of the active region adjacent to the field region and opens an edge of the transfer transistor;

forming a second doping region of the first conductivity type on the first doping region using a second ion implantation mask which covers the transfer transistor;

forming a third doping region of the second conductivity type on the second doping region using a third ion implantation mask which covers the portion of the active region adjacent to the field region and opens an edge of the transfer transistor, wherein the first and third doping regions are connected to each other; and forming a fourth doping region of the first conductivity type on the third doping region using a fourth ion implantation mask, which opens the active region.

6. The method as recited in claim 5, wherein the second and fourth doping regions are connected to each other at a boundary between the active region and the field region.

7. The method as recited in claim 5, wherein the first and third doping region are connected to each other beneath an edge of the transfer transistor.

8. The method as recited in claim 5, wherein the first and second conductivity types are P-type and N-type, respectively.

9. A method for forming a pinned photodiode for an image sensor, the method comprising the steps of:

preparing a semiconductor layer of a first conductivity type; and alternately forming N-type impurity regions and a P-type impurity region using first and second ion implantation masks, wherein the first ion implantation mask covers a portion of the active region adjacent to the field region and opens an edge of the transfer transistor and wherein the second ion implantation mask covers the transfer transistor.

10. The method as recited in claim 1, wherein the first doping region is divided into two doping subregions having different impurity concentrations.

11. A method for forming a pinned photodiode for an image sensor, the method comprising the steps of:

preparing a semiconductor layer of a first conductivity type;

forming a field oxide layer to isolate an active region from a field region;

forming a first ion implantation mask, an edge of which covers a portion of the active region adjacent to the field region;

opening the active region;

sequentially forming a first doping region and a second doping region through two ion implantation processes with different ion implantation energies;

removing the first ion implantation mask;

forming a second ion implantation mask, an edge of which is positioned at a boundary between the field and active regions;

opening the active region; and forming a third doping region between a surface of the semiconductive layer and the second doping region.

12. The method as recited in claim 10, wherein the first and the second doping regions are each doped with N-type material and the third doping region is doped with P-type material.

* * * * *